United States Patent
Kwon et al.

(10) Patent No.: US 7,863,955 B2
(45) Date of Patent: Jan. 4, 2011

(54) SEMICONDUCTOR DEVICE AND OPERATION METHOD THEREOF

(75) Inventors: Dae-Han Kwon, Kyoungki-do (KR); Kyung-Hoon Kim, Kyoungki-do (KR); Dae-Kun Yoon, Kyoungki-do (KR); Taek-Sang Song, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 9 days.

(21) Appl. No.: 12/005,564

(22) Filed: Dec. 27, 2007

(65) Prior Publication Data

US 2009/0115459 A1 May 7, 2009

(30) Foreign Application Priority Data

Nov. 5, 2007 (KR) .................... 10-2007-0112064

(51) Int. Cl.
*H03K 3/017* (2006.01)
(52) U.S. Cl. ...................... 327/175; 327/296
(58) Field of Classification Search .................. None
See application file for complete search history.

(56) References Cited

U.S. PATENT DOCUMENTS 7,239,116 B2 * 7/2007 Tang ................... 323/282
2008/0159378 A1 * 7/2008 Kris .................... 375/238
2008/0246523 A1 * 10/2008 Murakami et al. ......... 327/175
2008/0265946 A1 * 10/2008 Spindler et al. ............. 327/24
2009/0128207 A1 * 5/2009 Chang et al. ............... 327/175
2009/0146700 A1 * 6/2009 Kim et al. ................. 327/144
2009/0146708 A1 * 6/2009 Yun et al. ................. 327/158

FOREIGN PATENT DOCUMENTS

| KR | 1020050064241 | 6/2005 |
| KR | 20070016737 | 2/2007 |

* cited by examiner

*Primary Examiner*—Long Nguyen
*Assistant Examiner*—Sibin Chen
(74) *Attorney, Agent, or Firm*—Blakely, Sokoloff, Taylor & Zafman

(57) ABSTRACT

A semiconductor device includes a pulse signal generating unit for generating a plurality of pulse signals each of which has a different pulse width from each other, a signal multiplexing unit for outputting one of the plurality of pulse signals as an enable signal in response to frequencies of external clock signals, and a duty ratio detecting unit for detecting a duty ratio of the external clock signals in response to the enable signal.

18 Claims, 3 Drawing Sheets

SEMICONDUCTOR DEVICE AND OPERATION METHOD THEREOF

CROSS-REFERENCES TO RELATED APPLICATION

The present application claims priority to Korean application number 10-2007-0112064, filed on Nov. 5, 2007, which is incorporated by reference in its entirety.

BACKGROUND OF THE INVENTION

The present invention relates to a semiconductor design technology and, more particularly, to a duty cycle correction circuit (DCC) for detecting and correcting a duty ratio of input clock signals.

Generally, a semiconductor device, such as a DDR SDRAM (Double Data Rate Synchronous DRAM), has been developed with large capacity, high speed and low current consumption. Particularly, in order to achieve high speed operation, the semiconductor device is designed to operate in response to a high-frequency external clock signal.

Recently, since the external clock signal operates at a high frequency of a few GHz and the semiconductor device operates in response to the high-frequency external clock signal, the quality of the external clock signal is very important. That is, if there are many jitter components in the input external clock signal or a duty ratio is far from 50:50, the operation timing of an internal circuit of the semiconductor device becomes wrong so that a stable circuit operation is not guaranteed.

In order to prevent such a problem, a duty cycle correction circuit for correcting the duty ratio to 50:50 is included in the semiconductor device.

FIG. 1 is a block diagram illustrating a conventional duty cycle correction circuit.

Referring to FIG. 1, the duty cycle correction circuit includes a buffer unit 110, a duty ratio detecting unit 130, a duty cycle correcting unit 150 and an oscillating unit 170.

The buffer unit 110 receives a positive external clock signal CLK_EXT and a negative external clock signal /CLK_EXT to output a positive input clock signal CLK_IN corresponding to the positive external clock signal CLK_EXT and a negative input clock signal /CLK_IN corresponding to the negative external clock signal /CLK_EXT. The positive external clock signal CLK_EXT and the positive input clock signal CLK_IN are nearly the same in phase. Also, the negative external clock signal /CLK_EXT and the negative input clock signal /CLK_IN are nearly the same in phase.

The duty ratio detecting unit 130 receives the positive input clock signal CLK_IN and the negative input clock signal /CLK_IN and compares them to output first and second detection signals DET_DCC1 and DET_DCC2 corresponding to the duty ratio of the positive and negative input clock signals CLK_IN and /CLK_IN.

The duty cycle correcting unit 150 receives the positive and negative input clock signals CLK_IN and /CLK_IN and corrects the duty ratio of the positive and negative input clock signals CLK_IN and /CLK_IN in response to the first and second detection signals DET_DCC1 and DET_DCC2. Thus, the finally outputted signals CLK_OUT and /CLK_OUT from the duty cycle correcting unit 150, of which the duty ratio is 50:50, have good quality.

The oscillating unit 170 generates an enable signal CTR_EN which enables the duty ratio detecting unit 130. The enable signal CTR_EN has a constant frequency. Thus, the duty ratio detecting unit 130 performs a detecting operation for a constant time which is repeated at a constant interval.

FIG. 2 is a circuit diagram illustrating the duty ratio detecting unit 130 of FIG. 1.

Referring to FIGS. 1 and 2, the duty ratio detecting unit 130 includes a differential I/O unit 210 for differentially receiving the positive input clock signal CLK_IN and the negative input clock signal /CLK_IN to output the first and second detection signals DET_DCC1 and DET_DCC2 corresponding to the duty ratio of the positive and negative input clock signals CLK_IN and /CLK_IN and an enable unit 230 for activating the differential I/O unit 210 in response to the enable signal CTR_EN.

A simple circuit operation of the duty cycle correction circuit will be described. First, the first and second detection signals DET_DCC1 and DET_DCC2 are in a high level by capacitors C1 and C2, respectively. The oscillating unit 170 outputs the enable signal CTR_EN having a constant frequency, and a first NMOS transistor NM1 of the enable unit 230 operates in response to the enable signal CTR_EN. Thus, the differential I/O unit 210 operates during a section in which the first NMOS transistor NM1 is turned on, that is, while the enable signal CTR_EN is in a high level.

The voltage levels of the first and second detection signals DET_DCC1 and DET_DCC2 change, according to the positive input clock signal CLK_IN and the negative input clock signal /CLK_IN. For example, if the section in which the positive input clock signal CLK_IN in a high level is longer than that in which the negative input clock signal /CLK_IN is in a high level, a second NMOS transistor NM2 is turned on longer than a third NMOS transistor NM3 so that there is much current which flows through the second NMOS transistor NM2. That is, the voltage level of the second detection signal DET_DCC2 becomes lower than that of the first detection signal DET_DCC1.

Then, the difference between the voltage levels of the first detection signal DET_DCC1 and the second detection signal DET_DCC2 becomes bigger during a detection section in the duty ratio detecting unit 130, and when the difference is more than a predetermined value, the differential I/O unit 210 amplifies and outputs the first and second detection signals DET_DCC1 and DET_DCC2.

The duty cycle correcting unit 150 (see FIG. 1) corrects the duty ratio of the positive and negative input clock signals CLK_IN and /CLK_IN which are inputted in response to the first and second detection signals DET_DCC1 and DET_DCC2.

As described above, the duty ratio detecting unit 130 performs a detecting operation in response to the enable signal CTR_EN having a constant frequency. Here, the longer an enable section of the enable signal CTR_EN is, the longer the duty ratio detecting unit 130 is enabled, allowing to perform a more precise detecting operation. The shorter the enable section of the enable signal CTR_EN is, the shorter the duty ratio detecting unit 130 is enabled, yielding a less precise detecting operation.

Meanwhile, the enable section of the enable signal CTR_EN should be differently designed according to the usage of the semiconductor device and the frequency of the external clock signals CLK_EXT and /CLK_EXT. In order to generate the enable signal CTR_EN having different enable sections per every semiconductor device, a designer should design the oscillating unit 170 to allow for such capability. Also, if an enable signal CTR_EN having a short enable section is used for a semiconductor device which needs a more precise detecting operation, the amplifying operation of the differential I/O unit 210 is not properly performed so that first and second detection signals DET_DCC1 and DET_DCC2 can be abnormally outputted. On the other hand, if an enable signal CTR_EN having a long enable section is used for a semiconductor device that needs a less precise detecting operation, the differential I/O unit 210 causes unnecessary current consumption.

Further, in case that the enable signal CTR_EN having a long enable section is used for the semiconductor device which needs a less precise detecting operation, since the semiconductor device cannot perform read and write operations before the duty of a clock is corrected, the unnecessarily long enable section of the enable signal CTR_EN becomes a factor in lowering the operation speed of the semiconductor device.

SUMMARY OF THE INVENTION

The present invention is directed to providing a semiconductor device capable of varying an operation timing in detecting a duty ratio according to surrounding circumstances and a method for operating the semiconductor device.

Also, the present invention is directed to providing a duty cycle correcting circuit for selecting a frequency of an enable signal in response to a frequency of an external clock signal and detecting a duty ratio for a predetermined time based on the selected frequency.

According to the present invention, a duty ratio of an input signal is effectively detected without unnecessary current consumption, by activating a frequency detection circuit with a desirable frequency based on the surrounding environments. Also, the semiconductor memory device according to the present invention can guarantee a high-speed operation by detecting the duty ratio through an effective operation and an optimized detecting time.

Particularly, in the present invention, a frequency of an activation signal is selected based on a frequency of an external frequency and a duty ratio of a clock signal is detected during the selection of the frequency of the activation signal, thereby detecting a desirable duty ratio detection signal with effective operation and minimum current consumption.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF THE SPECIFIC EMBODIMENTS

Hereinafter, the present invention will be described in detail through embodiments. The embodiments are just for exemplifying the present invention, and the scope of right to be protected of the present invention is not limited by them.

Figure 1:
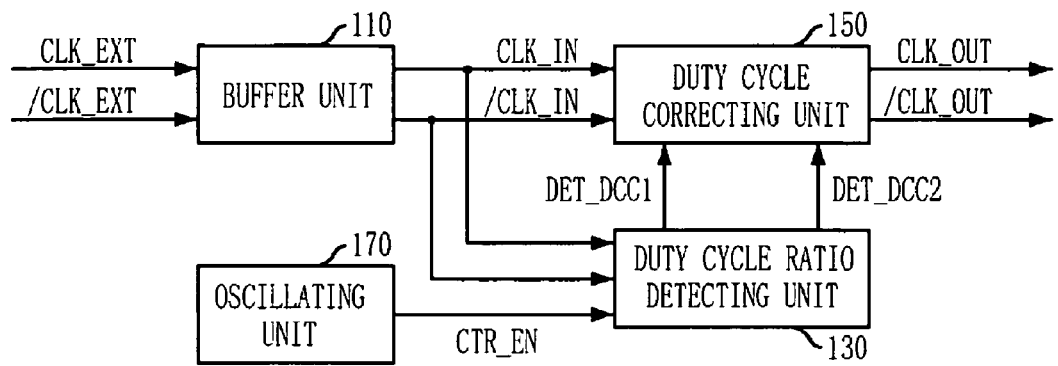
FIG. 1 is a block diagram illustrating a conventional duty cycle correcting circuit.
Figure 2:
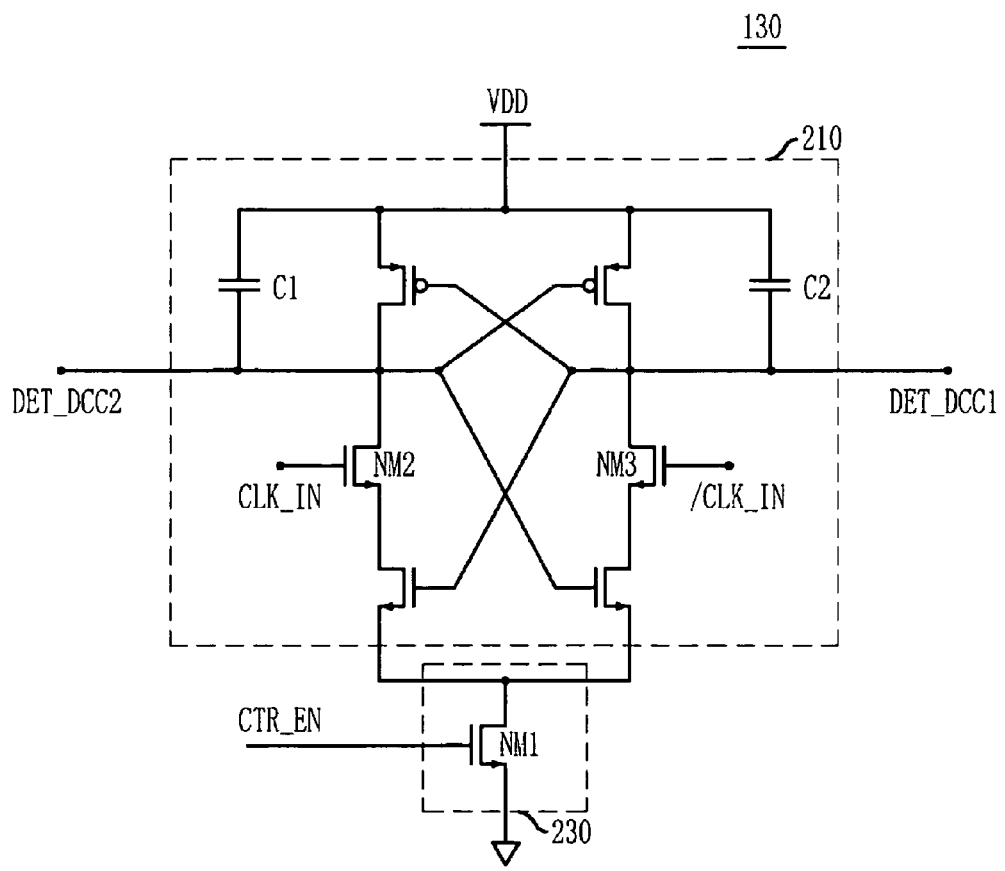
FIG. 2 is a circuit diagram illustrating a duty ratio detecting unit of FIG. 1.
Figure 3:
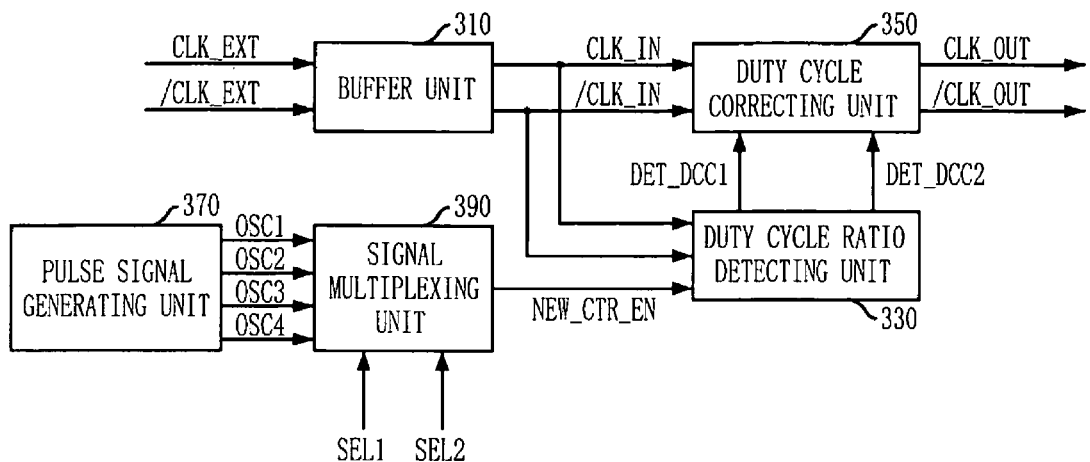
FIG. 3 is a block diagram illustrating a duty cycle correcting circuit according to the present invention.

FIG. 3 is a block diagram illustrating a duty cycle correcting circuit according to the present invention.

Referring to FIG. 3, the duty cycle correcting circuit includes a buffer unit 310, a duty ratio detecting unit 330, a duty cycle correcting unit 350, a pulse signal generating unit 370 and a signal multiplexing unit 390.

The buffer unit 310 receives a positive external clock signal CLK_EXT and a negative external clock signal /CLK_EXT to output a positive input clock signal CLK_IN corresponding to the positive external clock signal CLK_EXT and a negative input clock signal /CLK_IN corresponding to the negative external clock signal /CLK_EXT. The positive external clock signal CLK_EXT and the positive input clock signal CLK_IN are nearly the same in phase. Also, the negative external clock signal /CLK_EXT and the negative input clock signal /CLK_IN are nearly the same in phase. The positive external clock signal CLK_EXT is out of phase with the negative external clock signal /CLK_EXT.

The duty ratio detecting unit 330 is activated in response to an enable signal NEW_CTR_EN and compares the positive input clock signal CLK_IN and the negative input clock signal /CLK_IN to output first and second detection signals DET_DCC1 and DET_DCC2 corresponding to the duty ratio of the positive and negative input clock signals CLK_IN and /CLK_IN.

The duty cycle correcting unit 350 receives the positive and negative input clock signals CLK_IN and /CLK_IN and corrects the duty ratio of the positive and negative input clock signals CLK_IN and /CLK_IN in response to the first and second detection signals DET_DCC1 and DET_DCC2. Thus, the finally outputted signals CLK_OUT and /CLK_OUT from the duty cycle correcting unit 350 have the duty ratio of 50:50.

The pulse signal generating unit 370 generates first to fourth pulse signals OSC1, OSC2, OSC3 and OSC4 each of which has a different pulse width, namely, a different frequency, from each other.

The signal multiplexing unit 390 outputs one of the first to fourth pulse signals OSC1, OSC2, OSC3 and OSC4 as the enable signal NEW_CTR_EN in response to selection signals SEL1 and SEL2 which correspond to the frequencies of the external clock signals CLK_EXT and /CLK_EXT.

According to the present invention, since one of the first to fourth pulse signals OSC1, OSC2, OSC3 and OSC4, each of which has a different pulse width from each other, is selected as the enable signal NEW_CTR_EN in response to the frequencies of the external clock signals CLK_EXT and /CLK_EXT, namely, the operating frequency of the semiconductor device, the duty ratio detecting unit 330 can be activated for a desired period.

Figure 4:
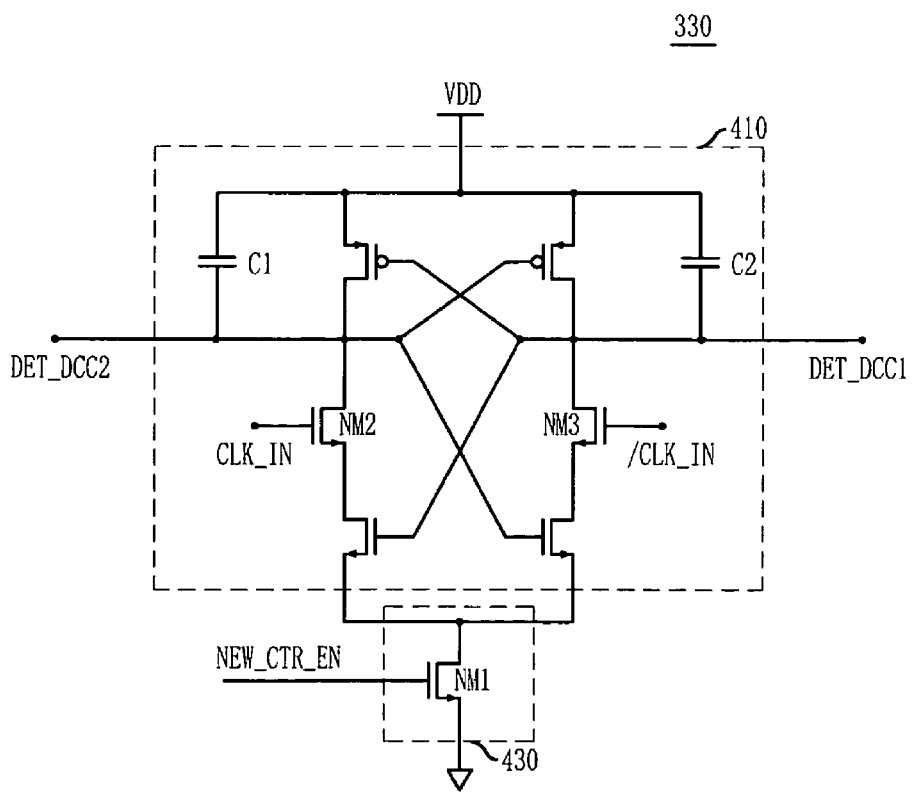
FIG. 4 is a circuit diagram illustrating a duty ratio detecting unit of FIG. 3.

FIG. 4 is a circuit diagram illustrating the duty ratio detecting unit 330 of FIG. 3.

Referring to FIGS. 3 and 4, the duty ratio detecting unit 330 includes a differential I/O unit 410 for differentially receiving the positive and negative input clock signals CLK_IN and /CLK_IN to output the first and second detection signals DET_DCC1 and DET_DCC2 corresponding to the duty ratio of the positive and negative input clock signals CLK_IN and /CLK_IN and an enable unit 430 for activating the differential I/O unit 410 in response to the enable signal NEW_CTR_EN.

A simple circuit operation of the duty cycle correction circuit will be described. First, the first and second detection signals DET_DCC1 and DET_DCC2 are in a high level by capacitors C1 and C2. A first NMOS transistor NM1 of the enable unit 430 operates in response to the enable signal NEW_CTR_EN. Thus, the differential I/O unit 410 operates during a section in which the first NMOS transistor NM1 is turned on, that is, while the enable signal NEW_CTR_EN is in a high level.

The voltage levels of the first and second detection signals DET_DCC1 and DET_DCC2 become lower according to the positive input clock signal CLK_IN and the negative input clock signal /CLK_IN. For example, if the section in which the positive input clock signal CLK_IN in a high level is longer than that in which the negative input clock signal /CLK_IN is in a high level, a second NMOS transistor NM2 is turned on longer than a third NMOS transistor NM3 so that there is much current which flows through the second NMOS transistor NM2. That is, the voltage level of the second detection signal DET_DCC2 becomes lower than that of the first detection signal DET_DCC1.

Although the operation of the duty ratio detecting unit 330 of the present invention is the same as the conventional duty ratio detecting unit, the duty ratio detecting unit 330 of the present invention is different from the conventional duty ratio detecting unit in that the improved enable signal NEW_CTR_EN is inputted to the duty ratio detecting unit 330.

Figure 5:
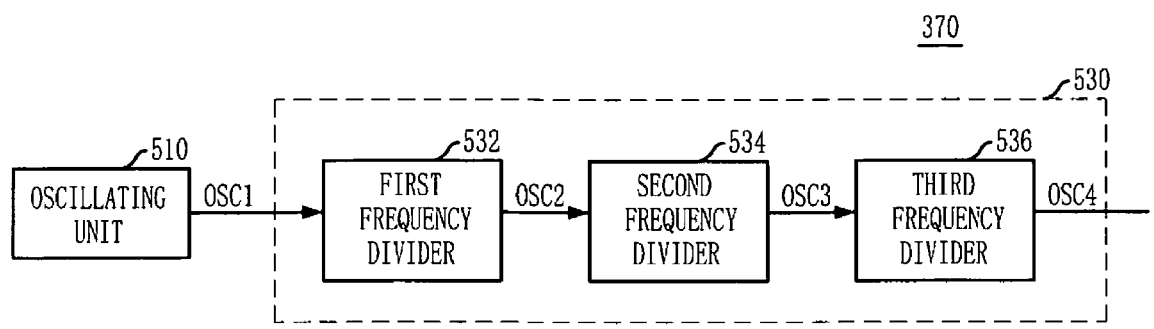
FIG. 5 is a block diagram illustrating a pulse signal generating unit of FIG. 3.

FIG. 5 is a block diagram illustrating the pulse signal generating unit 370 of FIG. 3.

Referring to FIG. 5, the pulse signal generating unit 370 includes an oscillating unit 510 for outputting a first oscillation signal OSC1 (hereinafter, the first pulse signal) of an expected frequency and a plurality of frequency dividers 530 for dividing the first pulse signal OSC1 to generate the second to fourth pulse signals OSC2, OSC3 and OSC4 each of which has a different pulse width from each other.

The plurality of the frequency dividers 530 include a first frequency divider 532 for receiving the first pulse signal OSC1 and dividing the first pulse signal OSC1 to generate the second pulse signal OSC2, a second frequency divider 534 for receiving the second pulse signal OSC2 and dividing the second pulse signal OSC2 to generate the third pulse signal OSC3, and a third frequency divider 536 for receiving the third pulse signal OSC3 and dividing the third pulse signal OSC3 to generate the fourth pulse signal OSC4.

Therefore, the pulse width of the first pulse signal OSC1 is longer than that of the second pulse signal OSC2, the pulse width of the second pulse signal OSC2 is longer than that of the third pulse signal OSC3, and the pulse width of the third pulse signal OSC3 is longer than that of the fourth pulse signal OSC4.

Figure 6:
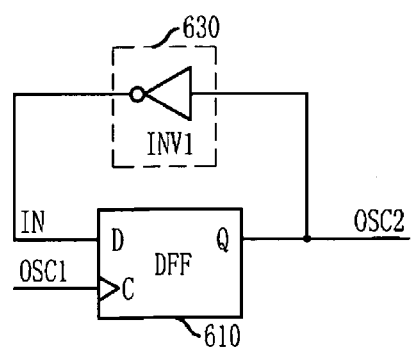
FIG. 6 is a diagram illustrating a frequency divider of FIG. 5.

FIG. 6 is a diagram illustrating the plurality of the frequency dividers 530 of FIG. 5. For convenience sake in description, only the first frequency divider 532 is illustrated.

Referring to FIG. 6, the first frequency divider 532 includes a latch unit 610 for latching an input signal IN in response to the first pulse signal OSC1 and outputting the second pulse signal OSC2 and a feedback unit 630 for receiving an output signal of the latch unit 610 and outputting a feedback signal to the latch unit 610.

The latch unit 610 includes a D-flip flop circuit DFF for outputting the input signal IN in response to a rising edge of the first pulse signal OSC1, and the feedback unit 630 includes an inverter INV1 for inverting an output signal of the D-flip flop circuit DFF.

Referring again to FIG. 3, the first to fourth pulse signals OSC1, OSC2, OSC3 and OSC4 generated from the pulse signal generating unit 370 are inputted to the signal multiplexing unit 390, and the signal multiplexing unit 390 outputs one of the first to fourth pulse signals OSC1, OSC2, OSC3 and OSC4 as the enable signal NEW_CTR_EN according to the first and second selection signals SEL1 and SEL2.

It is desirable to make the number of the first and second selection signals SEL1 and SEL2, which select the first to fourth pulse signals OSC1, OSC2, OSC3 and OSC4, correspond to the number of the first to fourth pulse signals OSC1, OSC2, OSC3 and OSC4. Here, the signal multiplexing unit 390 selects each of the four pulse signals OSC1, OSC2, OSC3 and OSC4 with the two selection signals SEL1 and SEL2 and outputs the pulse signal as the enable signal NEW_CTR_EN.

The first and second selection signals SEL1 and SEL2 can be obtained through a mode register set or a test signal. They have only to contain information on the frequencies of the external clock signals CLK_EXT and /CLK_EXT.

That is, as the external clock signals CLK_EXT and /CLK_EXT have a higher frequency, the signal multiplexing unit 370 selects the pulse signal having a low frequency according to the first and second selection signals SEL1 and SEL2 having the information on the frequencies of the external clock signals CLK_EXT and /CLK_EXT and outputs the pulse signal as the enable signal NEW_CTR_EN. Also, as the external clock signals CLK_EXT and /CLK_EXT have a lower frequency, the signal multiplexing unit 370 selects the pulse signal having a high frequency according to the first and second selection signals SEL1 and SEL2 having the information on the frequencies of the external clock signals CLK_EXT and /CLK_EXT and outputs the pulse signal as the enable signal NEW_CTR_EN.

Accordingly, as the external clock signals CLK_EXT and /CLK_EXT have a higher frequency, the duty ratio detecting unit 330 receives the enable signal NEW_CTR_EN of a wide pulse width to perform a preciser detecting operation, and as the external clock signals CLK_EXT and /CLK_EXT have a lower frequency, the duty ratio detecting unit 330 receives the enable signal NEW_CTR_EN of a narrow pulse width to perform a detecting operation which is less precise but consumes less current.

Further, since the read and write operations of the semiconductor device can be performed right after the duty cycle correction due to the enable signal NEW_CTR_EN having a desired enable section, the operation speed of the semiconductor device can be optimized.

While the present invention has been described with respect to the particular embodiments, it will be apparent to those skilled in the art that various changes and modifications may be made without departing from the spirit and scope of the invention.

For example, although the D-flip flop circuit is used in one embodiment of the present invention, it is also possible to use another kind of circuit instead of the D-flip flop circuit. Also, the position and kind of the logic gate and transistor shown in one embodiment of the present invention can be differently employed according to the polarity of inputted signals.

Further, although the case of detecting the duty ratio of the external clock signals is described in one embodiment of the present invention, the duty ratio of another kind of clock signals can also be detected in the present invention.

What is claimed is:

1. A semiconductor device comprising:
   a pulse signal generating unit configured to generate a plurality of pulse signals each of which has a different pulse width;
   a signal multiplexing unit configured to output one of the plurality of the pulse signals as an enable signal in response to a selection signal corresponding to frequencies of external clock signals;
   a duty ratio detecting unit configured to detect a duty ratio of the external clock signals in response to the enable signal; and
   a duty cycle correcting unit configured to correct the duty ratio of the external clock signals in response to a detection signal outputted from the duty ratio detecting unit.

2. The semiconductor device of claim 1, wherein the enable signal has a wide pulse width when the external clock signals have high frequencies and wherein the enable signal has a narrow pulse width when the external clock signals have low frequencies.

3. The semiconductor device of claim 1, wherein the pulse signal generating unit includes:
   an oscillating unit for outputting an oscillation signal; and
   a plurality of frequency dividers for dividing the oscillation signal to generate the plurality of the pulse signals each of which has a different pulse width.

4. The semiconductor device of claim 3, wherein each of the plurality of the frequency dividers includes:
   a latch unit for latching an input signal in response to the oscillation signal and outputting the pulse signal; and
   a feedback unit for receiving an output signal of the latch unit and outputting a feedback signal to the latch unit.

5. The semiconductor device of claim 4, wherein the latch unit includes a flip-flop circuit for outputting the input signal in response to the oscillation signal.

6. The semiconductor device of claim 1, wherein the signal multiplexing unit includes a transfer unit for transferring said one of the plurality of pulse signals as the enable signal in response to the selection signal corresponding to the frequencies of the external clock signals.

7. The semiconductor device of claim 6, wherein the selection signal is outputted from a mode register set.

8. The semiconductor device of claim 1, wherein the signal multiplexing unit selects one of the pulse signals that has a low frequency when the frequencies of the external clock signals are high, and wherein the signal multiplexing unit selects one of the pulse signals that has a high frequency when the frequencies of the external clock signals are low.

9. The semiconductor device of claim 1, wherein the external clock signals include a first external clock signal and a second external clock signal which is out of phase with the first external clock signal, and the first and second external clock signals are complementary.

10. The semiconductor device of claim 9, wherein the duty ratio detecting unit includes:
    a differential I/O unit for differentially receiving the first and second external clock signals to output a signal corresponding to the duty ratio of the external clock signals; and
    an enable unit for activating the differential I/O unit in response to the enable signal.

11. A method for operating a semiconductor device, comprising the steps of:
    determining frequencies of external clock signals;
    generating an enable signal in response to a selection signal corresponding to the frequencies of the external clock signals;
    detecting a duty ratio of the external clock signals in response to the enable signal; and
    correcting the duty ratio of the external clock signals in response to a detection signal which is detected at the step of detecting the duty ratio of the external clock signals.

12. The method of claim 11, wherein the enable signal has a wide pulse width when the frequencies of the external clock signals are high and wherein the enable signal has a narrow pulse width when the frequencies of the external clock signals are low.

13. The method of claim 11, wherein the step of generating the enable signal includes the steps of:
    outputting an oscillation signal;
    dividing the oscillation signal to generate a plurality of pulse signals each of which has a different pulse width; and
    selecting one from the plurality of pulse signals to output the selected pulse signal as the enable signal in response to the selection signal corresponding to the frequencies of external clock signals.

14. The method of claim 13, wherein the step of generating the plurality of pulse signals includes the steps of:
    latching an input signal in response to the oscillation signal;
    outputting the input signal, which is latched in response to the oscillation signal, as the pulse signal; and
    receiving the pulse signal to output a feedback signal as the input signal.

15. The method of claim 13, wherein the selection signal is outputted from a mode register set.

16. The method of claim 13, wherein the step of generating the enable signal selects one of the pulse signals that has a low frequency when the frequencies of the external clock signals are high and wherein the step of generating the enable signal selects one of the pulse signals that has a high frequency when the frequencies of the external clock signals are low.

17. The method of claim 11, wherein the external clock signals include a first external clock signal and a second external clock signal which is out of phase with the first external clock signal, and the first and second external clock signals are complementary.

18. The method of claim 17, wherein the step of detecting the duty ratio of the external clock signals includes the steps of:
    differentially receiving the first and second external clock signals and outputting a signal corresponding to the duty ratio of the external clock signals; and
    outputting the signal corresponding to the duty ratio of the external clock signals in response to the enable signal.

* * * * *